United States Patent [19]

Sano et al.

[11] Patent Number: 4,644,278

[45] Date of Patent: Feb. 17, 1987

[54] NUCLEAR MAGNETIC RESONANCE IMAGING APPARATUS

[75] Inventors: Koichi Sano, Yokohama; Tetsuo Yokoyama, Tokyo; Shimbu Yamagata; Koichi Haruna, both of Yokohama, all of Japan

[73] Assignee: Hitachi, Ltd., Tokyo, Japan

[21] Appl. No.: 694,743

[22] Filed: Jan. 25, 1985

[30] Foreign Application Priority Data

Jan. 27, 1984 [JP] Japan ................................. 59-13111

[51] Int. Cl.[4] ............................................. G01R 33/20
[52] U.S. Cl. ..................................... 324/309; 324/307
[58] Field of Search ............... 324/300, 307, 309, 311, 324/312, 313, 318, 319, 322

[56] References Cited

U.S. PATENT DOCUMENTS 4,021,726  5/1977  Garroway ........................... 324/312

Primary Examiner—Michael J. Tokar
Attorney, Agent, or Firm—Antonelli, Terry & Wands

[57] ABSTRACT

An NMR imaging apparatus is disclosed, which comprises imaging means for measuring a cross section of an object to be inspected with a high speed and for reconstructing an image of said cross section, means for specifying a region of interest in the image of the object to be inspected thus reconstructed by said imaging means, and gradient magnetic field control means for controlling a gradient of a magnetic field so that the gradient of the magnetic field at the specified region of interest is substantially greater than that at the other regions, whereby an enlarged image with high image quality at the region of interest is obtained by reconstructing an image of said region of interest after having raised the gradient of the magnetic field at least at said region of interest by means of said gradient magnetic field control means.

10 Claims, 6 Drawing Figures

NUCLEAR MAGNETIC RESONANCE IMAGING APPARATUS

CROSS REFERENCE TO RELATED APPLICATION

This invention relates to the subject matter of U.S. patent application Ser. No. 578,790 filed on Feb. 10, 1984, now U.S. Pat. No. 4,607,222, and assigned to the present assignee.

BACKGROUND OF THE INVENTION

1. Field of the Invention

This invention relates to a tomographic apparatus for obtaining images of the interior of a body using nuclear magnetic resonance (NMR) phenomenon, i.e. so-called NMR imaging apparatus, and more particularly to an NMR imaging apparatus permitting observation of enlarged images of a region of interest (R.O.I.) of a patient, etc. in detail.

2. Description of the Prior Art

The NMR phenomenon, which was discovered independently by Bloch and Purcell in 1946, has become, since then, an indespensable analyzing means for analysis of the structure of matter and for other physical and chemical fields.

This NMR phenomenon is a magnetic interaction of the magnetic moment of nuclei with an external field and has characteristics that the magnetic energy is considerably smaller (about $10^{-9}$) than that used for X-ray computed tomography and has almost no influences on the living body, e.g. human body.

The attempt to apply this NMR phenomenon to the imaging was proposed at first by Lauterbur in 1974. Although a number of NMR imaging methods have been developed thereafter, nowadays pulse methods, which are excellent in measurement precision and S/N ratio, are most often utilized. The details of the pulse NMR imaging method is described e.g. in "Pulse and Fourier transformation NMR" written by Farrer and Becker and translated in Japanese by Akasaka and Imoto, Yoshioka Publishing Co. (1979), etc.

All the pulse methods utilized at present are methods by which an object to be inspected is excited by a powerful pulse high frequency magnetic field covering all the Larmor frequencies contained by the object to be inspected and free induction decay (hereinbelow abbreviated to FID) signals produced thereby are analyzed in frequency.

Among the pulse methods mentioned above are utilized the following various methods and their combinations:

(1) Fourier transform method;
(2) projection reconstruction method;
(3) selective excitation method; and
(4) alternating gradient magnetic field method.

Each of these methods described above has both merits and demerits. For example the Fourier transform method and the projection reconstruction method have a problem that measurement time is long, although relatively good image quality can be obtained, and it is basically difficult to promote further speed-up which has been already realized. On the other hand the selective excitation method is characterized in that although image quality is not so good, measurement time is shorter.

In the case where a cross section of an object to be inspected is imaged, it is sometimes desirable not to image a whole cross section, but to image only a particular region of interest with high precision in an enlarged scale. An example for it is the case where it is desired to know variations of an affected part after an operation or medication, etc.

In this case, it is necessary to know previously the position of the region of interest mentioned above. Usually it is conceived to specify its approximate position on the basis of tomographs made beforehand, but in general it is difficult to locate a new image at an affected part which was imaged previously.

Accordingly a method, by which the region of interest is specified on the basis of an image taken just before an enlarged imaging, has been adopted.

However, in this case, since a long measurement time is necessary for the projection reconstruction method, apart from too much fruitless long wait time until a doctor can specify the region of interest, this provokes a problem that the through-put of the apparatus is made worse. To the contrary, by the selective excitation method, since its image quality is not sufficient, satisfactory effect cannot be expected, even if an enlarged image is made.

SUMMARY OF THE INVENTION

This invention has been effected in view of the circumstances mentioned above and its object is to provide an NMR imaging apparatus permitting to resolve the problems stated above in the prior art NMR imaging apparatus for enlargement, and to specify rapidly and adequately the region of interest (ROI) which is to be imaged in an enlarged scale and at the same time to obtain enlarged images of the region of interest (ROI) with sufficiently good image quality.

This object of this invention can be achieved by specifying a region of interest in an image representing a cross section of an object to be inspected reconstructed by means of an imaging means permitting to effect high speed measurements and by reconstructing an image of the region of interest after having raised the gradient of the magnetic field at the region of interest thus specified to a value, which is substantially greater than that at the other regions.

DESCRIPTION OF THE PREFERRED EMBODIMENTS

Figure 1:
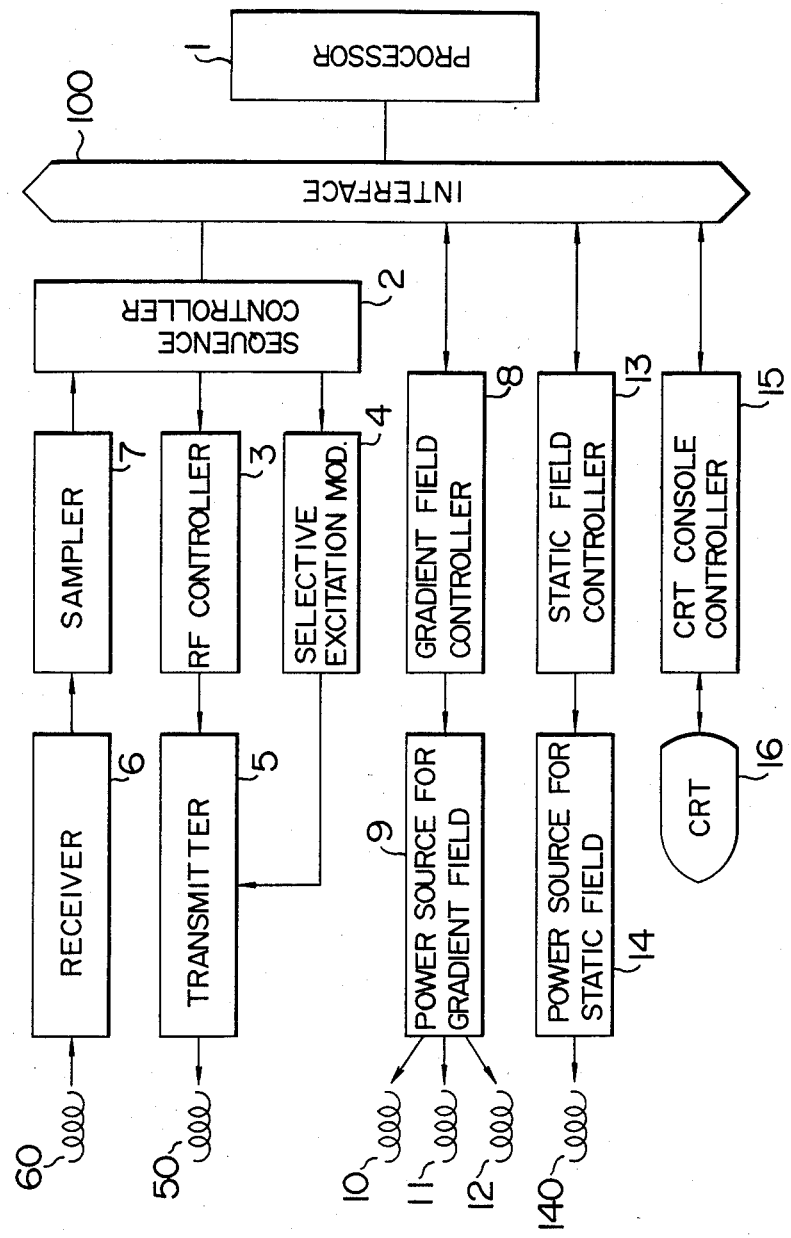
FIG. 1 is a block diagram representing the construction of an embodiment of NMR imaging apparatuses according to this invention.

FIG. 1 is a block diagram representing the construction of an embodiment of this invention. In the figure a processing device 1 controlling the whole system and reconstructing images on the basis of measured data controls through an interface 100, by means of a sequence control part 2 controlling various sorts of pulses produced in order to detect NMR signals coming from the object to be inspected and detected signals, an RF control part 3 controlling high frequency magnetic field generated in order to give rise to resonance of a specified nuclide in the object to be detected and a selective excitation modulation part 4 modulating at least one of the frequency and the amplitude of the high frequency magnetic field produced by the RF controller 3 and generating signals for selecting a frequency region by limiting the band of the frequency components. A transmitter 5 sends electric current to a coil 50, basing on signals obtained by the RF controller 3 and the selective excitation modulator 4.

Further, a receiver 6 detects NMR signals produced in the object to be inspected and obtained through a coil 60 and takes out FID signals and a data receiving part 7 effects A/D conversion of the signals obtained by the receiver 6.

A gradient magnetic field control part 8 generating an arbitrary gradient magnetic field depending on the purpose controls a power source for gradient magnetic field coils 9, which can control independently magnetic field generation coils 10, 11 and 12 for the x, y and z directions, respectively. A static magnetic field control part 13 controls a power source for static magnetic field coil 14, which in turn controls the static magnetic field determining the resonance frequency of the NMR signals by driving a coil 140.

Furthermore, a CRT console control part 15 displays results obtained by processing in the processor 1 stated above on a display device 16 such as a CRT and controls also an input device such as a write pen, a key board, etc.

Figure 2:
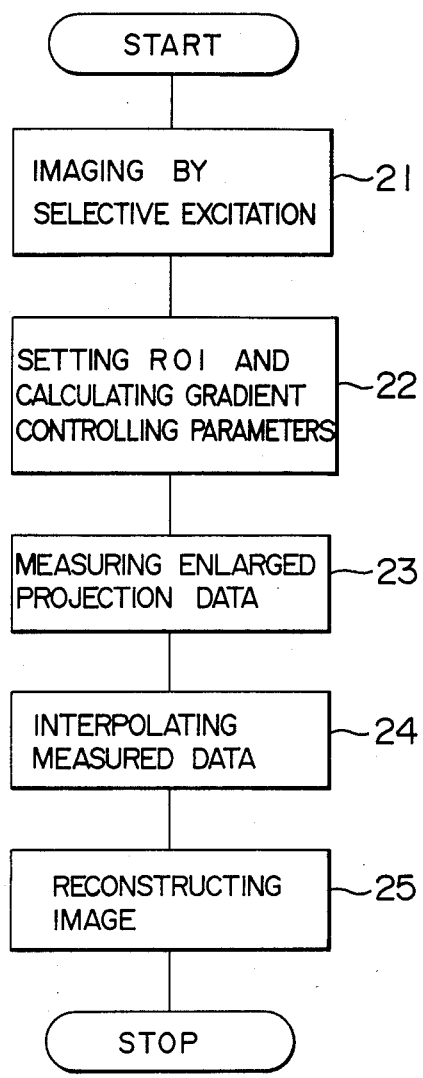
FIG. 2 is a flowchart representing the working mode of the embodiment.

Hereinbelow the working mode of the embodiment constructed as described above will be explained, referring to FIGS. 2-6, in particular using the flowchart representing the working mode shown in FIG. 2.

Figure 3:
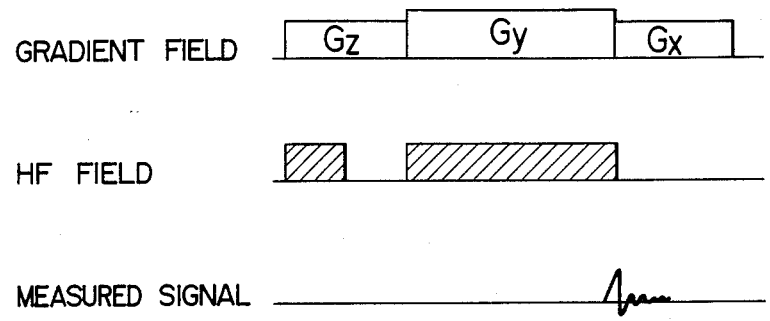
FIG. 3 is a scheme showing an example of pulse sequences according to the selective excitation method.

Step 21: A cross section passing through the affected part of the object to be inspected is imaged by the selective excitation method. The pulse sequence necessary for the imaging is stored beforhand in the sequence controller 2 described above. The pulse sequence is indicated in FIG. 3. The concrete procedure is as follows.

Figure 4:
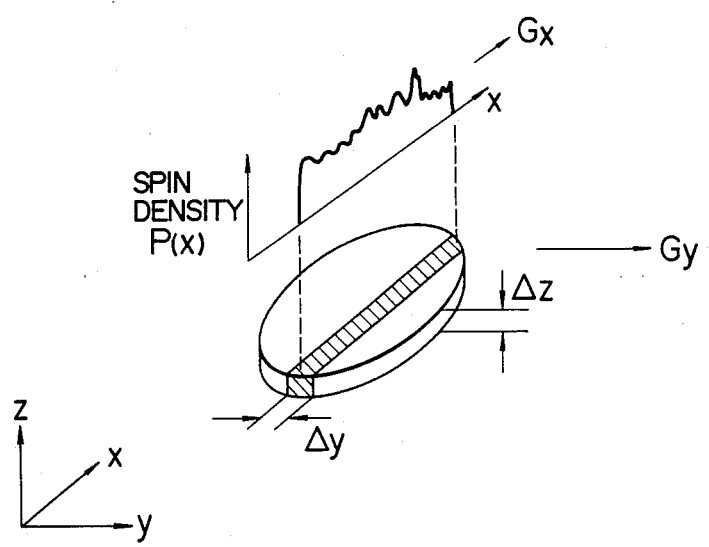
FIG. 4 is a scheme for explaining the scheme shown in FIG. 3.

(1) Apply a gradient magnetic field $G_z$ in the z direction and emit a selective saturation pulse, which saturates all the nuclear spins outside of a region $\Delta z$ indicated in FIG. 4.

(2) Apply a gradient magnetic field $G_y$ in the y direction and emit a selective excitation pulse, which excites only a $\Delta y$ region indicated in FIG. 4.

(3) By the operations described above only the hatched region in FIG. 4 is excited. Finally apply a gradient magnetic field $G_x$ in the x direction and observe generated FID signals.

(4) Obtained signals are Fourier transformed in the processor 1 and a nuclear spin density distribution for a stripe-shaped region having a width $\Delta y$, which is the hatched region in FIG. 4, is obtained.

(5) By returning to state (1) and repeating the same procedure after having changed the excited region in the y direction, it is possible to obtain the nuclear spin density distribution on the whole image.

Figure 5:
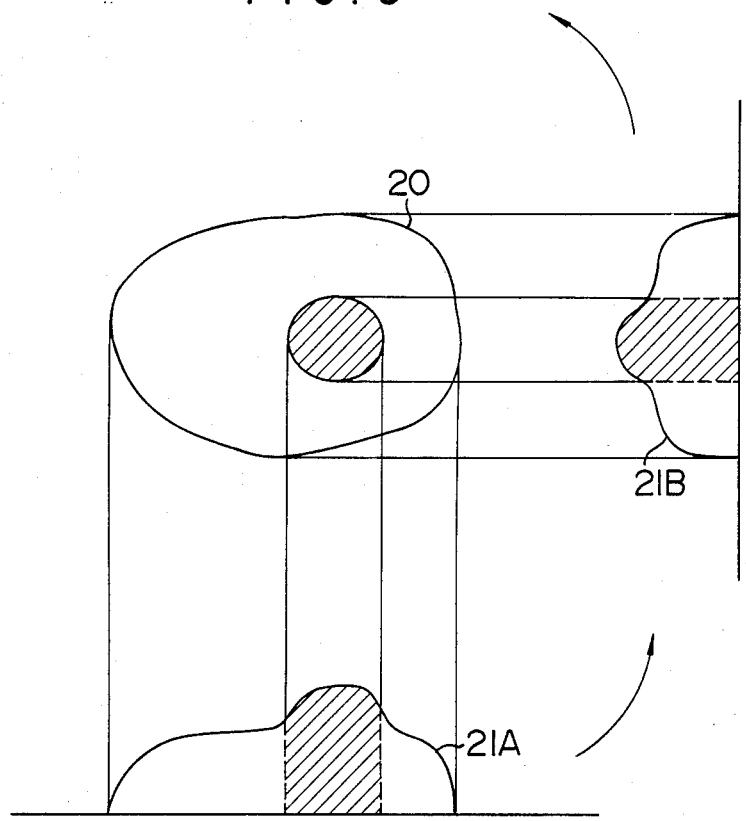
FIG. 5 is a scheme showing the relation between the region of interest and its projection data.

Step 22: A domain of the region of interest, for which an enlarged image is to be taken, is determined by using the image obtained in the preceding step. For the projection reconstruction method carried out in a following step it is necessary to obtained projection date of the nuclear spin data as indicated in FIG. 5 in directions over 180 degrees around the object to be inspected 20. For this purpose the gradient magnetic fields are rotated around the object to be inspected. At this time, as clearly seen from FIG. 5, the position of projection data 21A, 21B, ..., including the region of interest (the hatched region) varies.

This means that the domain in which the gradient of the magnetic fields should be large for enlarged imaging varies depending on the projection direction. Consequently, in this step, the parameters necessary for determining the form of the gradient magnetic fields, which is to be given for the measurements in the succeeding step, are calculated. These parameters represent more concretely the domain, in which the gradient of the magnetic fields should be large. This will be explained below more in detail, referring to FIG. 6.

Figure 6:
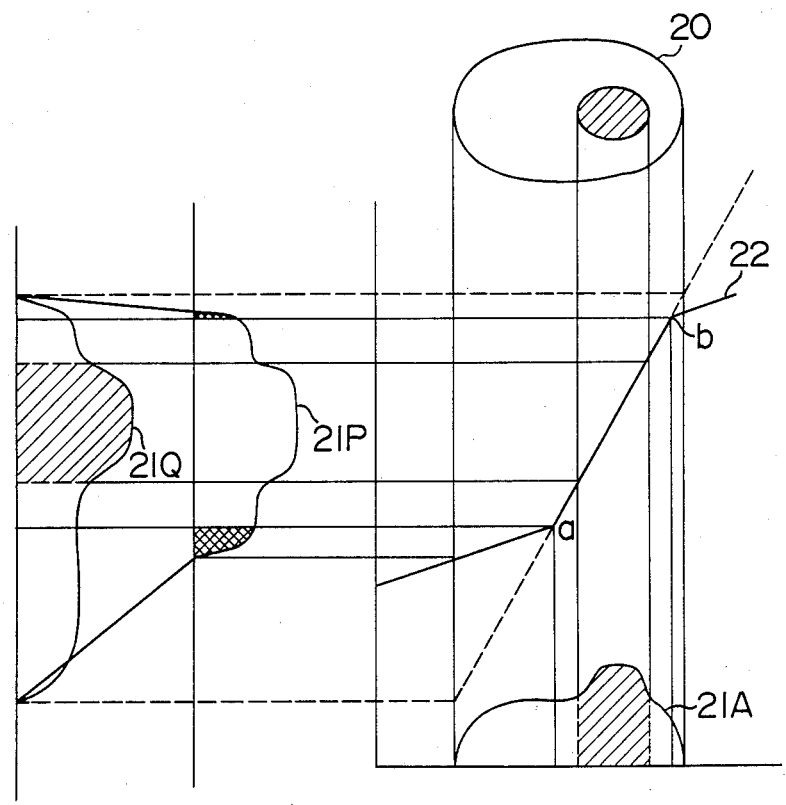
FIG. 6 is a scheme for explaining enlarged projection data.

FIG. 6 shows an example of varying the gradient of the magnetic field for enlarged imaging of the region of interest. In the figure, the reference numerals 20 and 21A denote, similarly to FIG. 5, the object to be inspected and projection data, respectively, and 22 represents a gradient magnetic field.

The gradient magnetic field 22 is so formed that the gradient is great between the points a and b so as to obtain enlarged images of a domain including the interested region of the object to be inspected 20 at the center and the points a and b are parameters stated above. According to the characteristics of the NMR signals, the greater the gradient of the magnetic fields is, the smaller the sampling distance is. Further, in FIG. 6, although the gradient magnetic field 22 is represented by a folded line, in reality it varies along a smoothly varying curve.

Step 23: Enlarged projection data are measured while applying gradient magnetic fields 22 such that sampling of projection data in the region of interest is effected with a small interval in accordance with the parameters (a, b) obtained in the preceding step.

Step 24: The projection data obtained by using the partially steep gradient magnetic field as stated above are, as indicated by 21P in FIG. 6, different from the projection data obtained by using a usual uniform gradient magnetic field and are distorted. That is, the projection data for the domain, in which the gradient is great, including the region of interest are enlarged, while in the other domains they are extremely compressed (cross hatched region). Therefore, the partially compressed projection data should be transformed into projection data representing a uniformly enlarged image, as indicated by 21Q, by interpolating the data at the compressed region.

Step 25: Since the projection data 21Q obtained in the preceding step are expressed in the form for which the image reconstruction algorithm for the inverse projection method used in X-ray computed tomographic devices can be applied as it is, it is possible to obtain an image by a Fourier transformation after filter treatment and an inverse projection operation.

Although in the embodiment described above the selective excitation method is used as imaging means for a high speed imaging and the projection reconstruction method is used as imaging means for obtaining an enlarged image of the region of interest, it is obvious that this invention is not at all limited to these methods.

As explained above, according to this invention, it is possible to realized an NMR imaging apparatus permitting to specify rapidly and adequately the region of interest which is to be imaged in an enlarged scale and at the same time to obtain enlarged images of the region of interest with sufficiently good image quality.

We claim:

1. A nuclear magnetic resonance (NMR) imaging apparatus comprising:

first imaging means for imaging a cross section of an object to be inspected according to a first imaging method of magnetic resonance integrated with a measurement operation and for reconstructing an image of said cross section;

means for selecting a region of interest in the image of the cross section reconstructed by said first imaging means;

coil means for establishing a gradient magnetic field;

gradient magnetic field control means for controlling a gradient of the magnetic field to be larger at the selected region of interest than that at the other regions; and second imaging means for imaging the cross section of the object including said selected region of interest according to a second imaging method of a different class of imaging than that of the first imaging method when the gradient of the magnetic field is controlled by said gradient magnetic field control means and reconstructing an image thus obtained.

2. A method of imaging a cross section of an object with partially enhanced image quality comprising the steps of:

taking a first image of the cross section with relatively low image quality by a first method of magnetic resonance integrated with a measurement operation in a relatively short period;

displaying the first image;

inputting parameters of a region of interest in said first image and a desired resolution therefor;

taking a second image of the cross section of the object including the region of interest with relatively high image quality with said desired resolution, by a second method of a different class of imaging from the first method; and reconstructing an image of the object with partially enhanced image quality for said region of interest.

3. A nuclear magnetic resonance imaging apparatus according to claim 1, wherein said first imaging method is a selective excitation method.

4. A nuclear magnetic resonance imaging apparatus according to claim 1, wherein said second imaging method is a projection reconstruction method.

5. A nuclear magnetic resonance imaging apparatus according to claim 1, wherein said first and second imaging methods are a selective excitation method and a projection reconstruction method, respectively.

6. A nuclear magnetic resonance imaging apparatus according to claim 1, wherein said second imaging means includes means for interpolating data outside of said selected region of interest.

7. A method of imaging according to claim 2, wherein said first method is a selective excitation method.

8. A method of imaging according to claim 2, wherein said second method is a projection reconstruction method.

9. A method of imaging according to claim 2, wherein said first and second methods are a selective excitation method and a projection reconstruction method, respectively.

10. A method of imaging according to claim 2, wherein the reconstructing of an image of the object with partially enhanced image quality for said region of interest includes interpolating data outside of said region of interest.

* * * * *